United States Patent
Hayashi

(10) Patent No.: US 6,600,672 B2
(45) Date of Patent: Jul. 29, 2003

(54) SEMICONDUCTOR MEMORY DEVICE

(75) Inventor: Mitsuaki Hayashi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/963,828

(22) Filed: Sep. 25, 2001

(65) Prior Publication Data

US 2002/0036914 A1 Mar. 28, 2002

(30) Foreign Application Priority Data

Sep. 26, 2000 (JP) .................................... 2000-292177

(51) Int. Cl.[7] .............................................. G11C 17/00
(52) U.S. Cl. .................. 365/104; 365/203; 365/230.06
(58) Field of Search ................ 365/203, 104, 365/230.06

(56) References Cited

U.S. PATENT DOCUMENTS

| 4,725,986 | A |   | 2/1988  | Kouba        |         |
|-----------|---|---|---------|--------------|---------|
| 4,773,047 | A | * | 9/1988  | Uchino et al. | 365/104 |
| 5,689,469 | A | * | 11/1997 | Asaka et al. | 365/203 |
| 5,754,485 | A | * | 5/1998  | Miura        | 365/104 |
| 5,815,450 | A |   | 9/1998  | Kimura       |         |
| 5,870,326 | A | * | 2/1999  | Schuelein    | 365/104 |
| 5,886,937 | A |   | 3/1999  | Jang         |         |
| 6,252,813 | B1 | * | 6/2001 | Liu          | 365/104 |
| 6,282,114 | B1 | * | 8/2001 | Hanriat et al. | 365/104 |
| 6,282,136 | B1 | * | 8/2001 | Sakurai et al. | 365/104 |

* cited by examiner

Primary Examiner—Huan Hoang
(74) Attorney, Agent, or Firm—Merchant & Gould P.C.

(57) ABSTRACT

A semiconductor memory device capable of reading out data at a higher speed and occupying a decreased chip-area is provided. The device includes a bit line selection circuit including a plurality of first transistors for selecting a plurality of bit lines according to a plurality of column selection signals generated based on address signals, a bit line charging circuit including a plurality of second transistors for charging the plurality of bit lines, respectively, and a bit line grounding circuit including a plurality of third transistors for connecting the plurality of bit lines with a ground potential. This enables the decrease in a charging time during a bit line precharging operation and a discharging time during data reading-out operation. Further, by grounding adjacent bit lines that are not involved in a precharging or reading-out operation so that they have a ground potential, it is also possible to minimize bit line intervals without causing a malfunction due to an increase in capacitances between the bit lines.

7 Claims, 11 Drawing Sheets

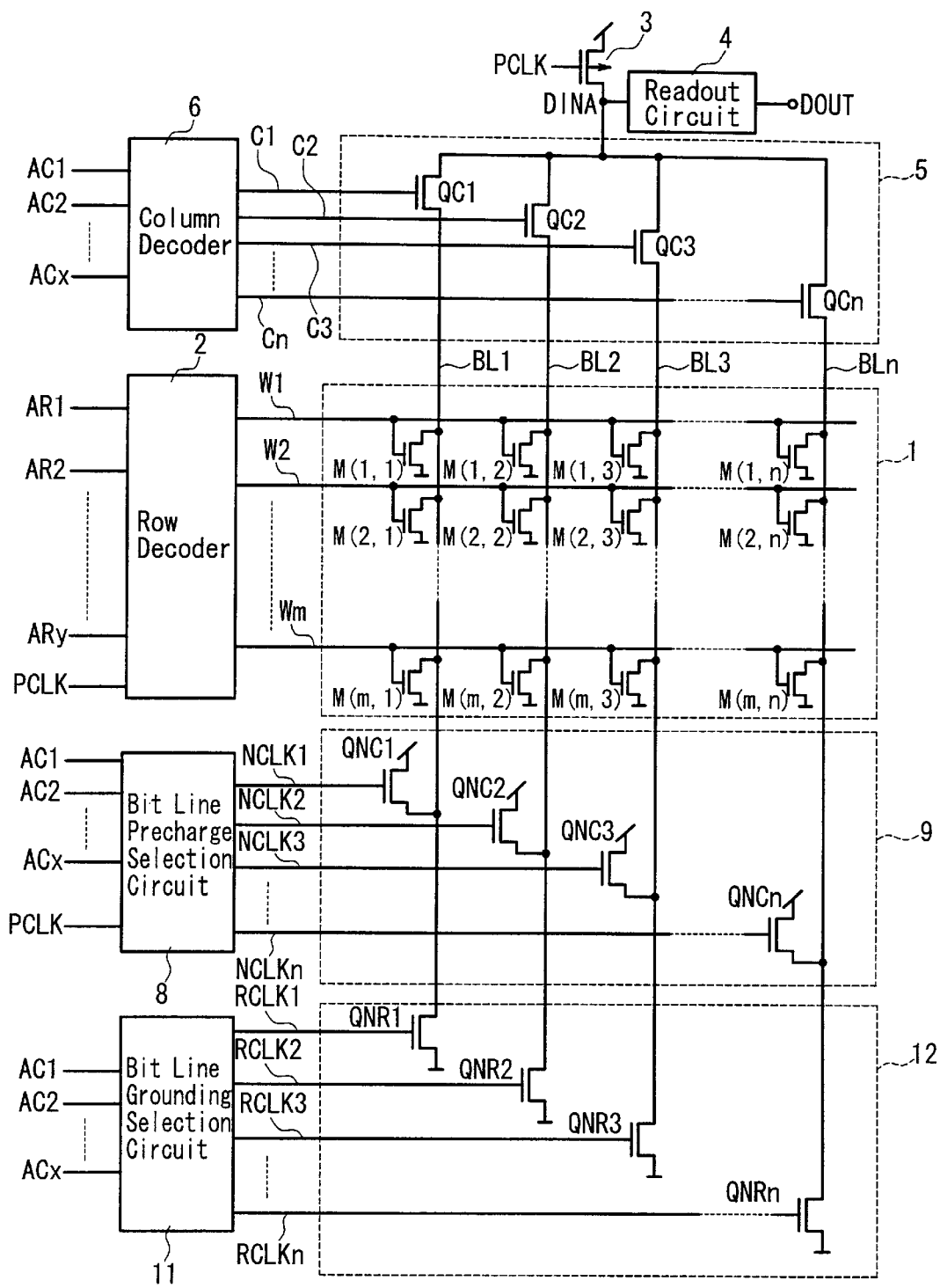
F I G. 5

SEMICONDUCTOR MEMORY DEVICE

BACKGROUND OF THE INVENTION

1. Field of the Invention

The present invention relates generally to a semiconductor memory device, and to a circuit technique that ensures high-speed readout even with a miniaturized device at low voltages.

2. Related Background Art

FIG. 9 is a circuit diagram illustrating a configuration of a contact-type mask ROM as a conventional semiconductor memory device. The contact-type mask ROM is configured so that the connection and the disconnection between a drain of a memory cell transistor and a bit line correspond to "1" and "0" as ROM data, respectively.

In FIG. 9, the conventional semiconductor memory device is composed of a memory cell array 1, a row decoder 2, a precharge transistor 3, a readout circuit 4, a bit line selection circuit 14, and a column decoder 15.

The memory cell array 1 includes memory cells M(i,j) (i=1 to m, j=1 to n) that are arrayed in matrix of m rows×n columns. Gates of the memory cells M(i,j) are connected with word lines Wi (i=1 to m), respectively. Sources thereof are connected to a ground potential, and drains thereof are connected to bit lines BLj (j=1 to n), respectively, when the memory cell data is "0", whereas they are floated when the memory cell data is "1".

The row decoder 2 is supplied with row addresses AR1 to ARy and a precharge signal PCLK as inputs thereto. The row decoder 2 makes all the word lines Wi (i=1 to m) unselected when the precharge signal PCLK is at a logic "L" level, and it selects the word lines Wi (i=1 to m) corresponding to inputs of the row addresses AR1 to ARy when the precharge signal PCLK is at a logic "H" level. In this conventional example, the selected word lines Wi have the "H" level, and the other lines Wi have the "L" level.

The precharge transistor 3 is a P-type MOS transistor whose source is connected with a power source potential, whose gate is fed with the precharge signal PCLK, and whose drain is connected to a connection DINA that is connected with the bit line selection circuit 14.

The readout circuit 4 amplifies a signal at the connection DINA connected with the bit line selection circuit 14, and outputs memory data to an output terminal DOUT. The output terminal DOUT outputs data of "1" when the connection DINA has the "H" level, and outputs data of "0" when the connection DINA has the "L" level.

The bit line selection circuit 14 is composed of N-type MOS transistors QNj (j=1 to n) whose sources are connected to bit lines BLj (j=1 to n), respectively, whose gates are connected to a bit line selection signal Cj (j=1 to n), respectively, and whose drains are connected to the connection DINA, and P-type MOS transistors QPj (j=1 to n) whose drains are connected to bit lines BLj (j=1 to n), respectively, whose sources are connected to bit line selection signals /Cj (j=1 to n), respectively, and whose sources are connected to a connection DINA connecting the drain of the precharge transistor 3 and the readout circuit 4.

The column decoder 15 selects bit line selection signals Cj (j=1 to n) and /Cj (j=1 to n) according to each of column addresses AC1 to ACx supplied thereto. In this conventional example, the selected Cj (j=1 to n) has the "H" level, while the other Cj (j=1 to n) has the "L" level. The selected /Cj (j=1 to n) has the "L" level, while the other /Cj (j=1 to n) has the "H" level.

An operation of reading out data from a memory cell M(i,j) in the semiconductor memory device thus configured is described with reference to a timing chart of FIG. 10, taking an operation of reading out data from a memory cell M(2,2) as an example. In this conventional example, in the initial state, the word lines Wi, the bit line selection signals Cj and /Cj, the bit lines BLj, the connection DINA, and the output terminal DOUT have a ground potential.

In FIG. 10, while the precharge signal PCLK is at the "L" level, the row addresses AR1 to ARy make transition to addresses for selecting the word line W2 and are inputted to the row decoder 2, and the column addresses AC1 to ACx make transition to addresses for selecting the bit line BL2 and are inputted to the column decoder 15.

Thus, the row decoder 2 makes all the word lines Wi (i=1 to m) have the "L" level so as to cause the memory cells M(i,j) whose gate are connected with the word lines Wi to be in the non-conducting state. The column decoder 15 causes the bit line selection signals C2 and /C2 corresponding to the second column to make transition to the "H" level and the "L" level, respectively, and causes the other bit line selection signals Cj (j=1, 3, . . . n) and /Cj (j=1, 3, . . . n) to make transition to the "L" level and to the "H" level, respectively. This causes only the N-type MOS transistor QN2 and the P-type MOS transistor QP2 to make transition to the conducting state, and so as to cause the other N-type MOS transistors QNj (j=1, 3, . . . n) and P-type MOS transistors QPj (j=1, 3, . . . , n) to make transition to the non-conducting state.

Since the precharge signal PCLK is at the "L" level, the precharge transistor 3 is in the conducting state, and the connection DINA that is connected with the bit line selection circuit 14 and the bit line BL2 connected with the N-type MOS transistor QN2 and the P-type MOS transistor QP2 that are in a state of being conducted are charged so as to have a power source potential over a period of time t0c.

Subsequently, since the precharge signal PCLK makes transition to the "H" level, the row decoder 2 causes the word line W2 to make transition to the "H" level, and causes the other word lines Wi (i=1, 3, . . . , m) to remain at the "L" level, so that the memory cells M(2,j) (j=1 to n) whose gates are connected with the word line W2 make transition to the conducting state.

Thereafter, when the memory cell M(2,2) is not connected with the bit line BL2, that is, the ROM data is "1", charges accumulated in the connection DINA and the bit line BL2 are not discharged, and the readout circuit 4 outputs data of "1" to the output terminal DOUT. On the other hand, when the memory cell M(2,2) is connected with the bit line BL2, that is, the ROM data is "0", charges accumulated in the connection DINA and the bit line BL2 are discharged, so that the readout circuit 4 outputs data of "0" to the output terminal DOUT after a period of time t0r.

This conventional semiconductor memory device has the following drawbacks.

Since several hundreds to several thousands of memory cell transistors are connected with a bit line in the semiconductor memory device, there has been a drawback in that it takes a long time to charge a bit line with a large capacity to the power source potential.

Besides, since the bit lines are precharged via the transistors composing the bit line selection circuit 14, in order to shorten the precharge time, a gate width of the precharge transistor 3 and gate widths of the transistors composing the bit line selection circuit 14 have to be widened so as to lower ON resistances of the transistors of the both.

However, when the gate widths of the transistors composing the bit line selection circuit 14 are widened, gate capacitances thereof increase, thereby causing load capacitances of bit line selection signals supplied to the gates to increase. This results in an increase in the load capacitances charged by the precharge transistor 3, thereby causing the time required for the bit line selection to be prolonged.

Besides, since the gate width of the memory cell transistor is reduced to be as small as possible with a view to decreasing the space occupied by the memory cell transistor, there also has been a drawback in that the ON resistance becomes high and that a time required for discharging charges accumulated up to the power source potential becomes long.

Furthermore, in the case where intervals between bit lines that are arranged parallel with each other by mask layout are minimized to a limit of the micromachining technology, there has been a drawback in that capacitances between the bit lines increase, thereby causing malfunctions due to this to occur.

The following description will depict the malfunctions stemming from the increase in the line capacitances between the bit lines, while referring to the circuit diagram of FIG. 9 and the timing chart of FIG. 11.

In FIG. 9, assume that the memory cells M(2,1) and M(2,3) are connected with the bit lines BL1 and BL3, respectively, and the other memory cells M(i,j) are not connected with the bit lines BLj.

(1) In FIG. 11, in the first period, while the precharge signal PCLK is at the "L" level, the row addresses AR1 to ARy make transition to addresses for selecting the word line W1 and are fed to the row decoder 2. On the other hand, the column addresses AC1 to ACx make transition to addresses for selecting the bit line BL1 and are fed to the column decoder 15.

First of all, the row decoder 2 causes all the word lines Wi (i=1 to m) to make transition to the "L" level, thereby causing the memory cells M(i,j) whose gates are connected with the word lines Wi (i=1 to m) to make transition to the non-conducting state. The column decoder 15 causes the bit line selection signals C1 and /C1 corresponding to the first column to make transition to the "H" level and the "L" level, respectively, while causing the other bit line selection signals Cj and /Cj (j=2 to n) to make transition to the "L" level and the "H" level, respectively, thereby causing the N-type MOS transistor QN1 and the P-type MOS transistor QP1 to make transition to the conducting state, and causing the other N-type MOS transistors QNj and P-type MOS transistors QPj (j=2 to n) to make transition to the non-conducting state.

Here, since the precharge signal PCLK is at the "L" level, the precharge transistor 3 makes transition to the conducting state. Therefore, the connection DINA connected with the bit line selection circuit 14, and the bit line BL1 connected with the N-type MOS transistor QN1 and the P-type MOS transistor QP1 that are in the conducting state, are charged.

Then, as the precharge signal PCLK makes transition to the "H" level, the row decoder 2 causes the word line W1 to make transition to the "H" level, and causes the other word lines Wi (i=2 to m) to remain at the "L" level, thereby causing the memory cells M(1,j) (j=1 to n) whose gates are connected with the word line W1 to make transition to the conducting state. Charges accumulated in the bit line BL1, however, are not discharged since the memory cell M(1,1) is not connected with the bit line BL1, and the potential of the bit line BL1 is maintained during the first period.

(2) Next, in the second period, while the precharge signal PCLK is at the "L" level, the row addresses AR1 to ARy maintain the address for selecting the word line W1 and are fed to the row decoder 2. On the other hand, the column addresses AC1 to ACx make transition to addresses for selecting the bit line BL3 and are fed to the column decoder 15.

First of all, the row decoder 2 causes all the word lines Wi (i=1 to m) to make transition to the "L" level, thereby causing the memory cells M(i,j) whose gates are connected with the word lines Wi (i=1 to m) to make transition to the non-conducting state, and the column decoder 15 causes the bit line selection signals C3 and /C3 corresponding to the third column to make transition to the "H" level and the "L" level, respectively. This causes the other bit line selection signals Cj and /Cj (j=1, 2, 4, . . . , n) to make transition to the "L" level and the "H" level, respectively. This causes the N-type MOS transistor QN3 and the P-type MOS transistor QP3 to make transition to the conducting state, and causes the other N-type MOS transistors QNj and P-type MOS transistors QPj (j=1, 2, 4, . . . , n) to make transition to the non-conducting state.

Here, since the precharge signal PCLK is at the "L" level, the precharge transistor 3 makes transition to the conducting state, and therefore, the connection DINA connected with the bit line selection circuit 14, and the bit line BL3 connected with the N-type MOS transistor QN3 and the P-type MOS transistor QP3 that are in the conducting state, are charged.

Then, as the precharge signal PCLK makes transition to the "H" level, the row decoder 2 causes the word line W1 to make transition to the "H" level, and causes the other word lines Wi (i=2 to m) to remain at the "L" level, thereby causing the memory cells M(1,j) (j=1 to n) whose gates are connected with the word line W1 to make transition to the conducting state. Charges accumulated in the bit line BL3, however, are not discharged since the memory cell M(1,3) is not connected with the bit line BL1, and the potential of the bit line BL3 is maintained during the second period. Besides, BL1 that was charged during the first period maintains its potential during the second period, since the charges are not discharged.

(3) Next, in the third period, while the precharge signal PCLK is at the "L" level, the row addresses AR1 to ARy makes transition to an address for selecting the word line W2 and are fed to the row decoder 2. On the other hand, the column addresses AC1 to ACx make transition to addresses for selecting the bit line BL2 and are fed to the column decoder 15.

First of all, the row decoder 2 causes all the word lines Wi (i=1 to m) to make transition to the "L" level, thereby causing the memory cells M(i,j) whose gates are connected with the word lines Wi (i=1 to m) to make transition to the non-conducting state, and the column decoder 15 causes the bit line selection signals C2 and /C2 corresponding to the second column to make transition to the "H" level and the "L" level, respectively, while causing the other bit line selection signals Cj and /Cj (j=1, 3, . . . , n) to make transition to the "L" level and the "H" level, respectively. This causes the N-type MOS transistor QN2 and the P-type MOS transistor QP2 to make transition to the conducting state, and causes the other N-type MOS transistors QNj and P-type MOS transistors QPj (j=1, 3, . . . , n) to make transition to the non-conducting state.

Here, since the precharge signal PCLK is at the "L" level, the precharge transistor 3 makes transition to the conducting state, and therefore, the connection DINA connected with the bit line selection circuit 14, and the bit line BL2 connected with the N-type MOS transistor QN2 and the P-type MOS transistor QP2 that are in the conducting state, are charged.

Then, as the precharge signal PCLK makes transition to the "H" level, the row decoder 2 causes the word line W2 to make transition to the "H" level, and causes the other word lines Wi (i=1, 3, ... m) to remain at the "L" level, thereby causing the memory cells M(2,j) (j=1 to n) whose gates are connected with the word line W2 to make transition to the conducting state.

Here, as assumed above, the memory cells M(2,1) and M(2,3) are connected with the bit lines BL1 and BL3, respectively, and hence, the charges accumulated in the bit lines BL1 and BL3 in the first and second periods, respectively, are discharged. Accordingly, from the bit line BL2 that is provided between the bit lines BL1 and BL3 and that has been charged while the precharge signal PCLK is at the "L" level in the third period, charges are discharged via the line capacities between the bit lines BL1 and BL2 and between the bit lines BL2 and BL3. This causes the potential of the bit line BL2 to decrease. As a result, the potential of the connection DINA decreases also, from the "H" level to the "L" level, thereby causing the readout circuit 4 to mistakenly output "0" to the output terminal DOUT, which is different from the data "1" stored in the memory cell M(2,2). This phenomenon is more noticeable as the line capacitance between the bit lines increases.

SUMMARY OF THE INVENTION

The present invention is intended to solve the aforementioned problems of the conventional semiconductor memory device, and it is an object of the present invention to provide a semiconductor memory device that is capable of reading out data at a higher speed and that does not undergo a malfunction even in the case where bit line intervals are minimized so as to reduce the chip area.

To achieve the foregoing object, a semiconductor memory device of the present invention is a semiconductor memory device that reads out data from memory cells provided in a matrix according to address signals supplied from outside. The semiconductor memory device includes a bit line selection circuit including a plurality of first transistors for selecting a plurality of bit lines, respectively, according to a plurality of column selection signals that are generated based on the address signals, and a bit line charging circuit including a plurality of second transistors for charging the plurality of bit lines, respectively.

In this semiconductor memory device, the plurality of first transistors and the plurality of second transistors preferably are N-type MOS transistors. Each of the plurality of first transistors preferably has a gate, a source, and a drain so that the plurality of column selection signals are supplied to the gates, respectively, the plurality of bit lines are connected with the sources, respectively, and a precharge transistor for commonly charging the plurality of bit lines and a readout circuit for outputting data from the memory cells are connected commonly with the drains. Each of the plurality of second transistors preferably has a gate, a source, and a drain so that a bit line precharge signal that is supplied from outside is supplied commonly to the gates, a power source potential is supplied to the sources, and the plurality of bit lines are connected with the drains, respectively.

Alternatively, the plurality of first transistors and the plurality of second transistors preferably are N-type MOS transistors. Each of the plurality of first transistors preferably has a gate, a source, and a drain so that the plurality of column selection signals are supplied to the gates, respectively, the plurality of bit lines are connected with the sources, respectively, and a precharge transistor for commonly charging the plurality of bit lines and a readout circuit for outputting data from the memory cells are connected commonly with the drains. Each of the plurality of second transistors preferably has a gate, a source, and a drain so that a plurality of first selection signals are supplied to the gates, respectively, a power source potential is supplied to the sources, and the plurality of bit lines are connected with the drains, respectively.

Furthermore, the semiconductor memory device preferably further includes a bit line grounding circuit that includes a plurality of third transistors for connecting the plurality of bit lines with a ground potential, respectively. The plurality of third transistors preferably are N-type MOS transistors, and each of the N-type MOS transistors has a gate, a source, and a drain so that a plurality of second selection signals having logic states opposite to those of the plurality of column selection signals, respectively, are supplied to the gates, respectively, the sources are connected with a ground potential, and the drains are connected with the plurality of bit lines, respectively.

In this case, the plurality of first selection signals preferably are generated based on the plurality of second selection signals so as to have a delay of a predetermined time relative to the plurality of second selection signals.

Alternatively, the plurality of first selection signals preferably are generated so that only the bit line selected according to the address signals is precharged.

According to the foregoing configuration, in addition to the precharging operation common to the bit lines, a precharging operation is carried out by the second transistors that are provided for the bit lines, respectively. Therefore, the charging time during the bit line precharging operation and the discharging time during the memory cell data reading-out operation can be shortened, whereby data can be read out at a higher speed. Besides, by grounding adjacent bit lines that are not involved in the precharging or reading-out operation so that they have a ground potential, it is possible to eliminate a malfunction due to an increase in line capacitances between the bit lines, even if the bit line intervals are reduced to a minimum level to decrease the chip area.

BRIEF DESCRIPTION OF THE DRAWINGS

FIG. 5 is a circuit diagram illustrating a configuration of a semiconductor memory device according to a third embodiment of the present invention.

DETAILED DESCRIPTION OF THE INVENTION

Figure 1:
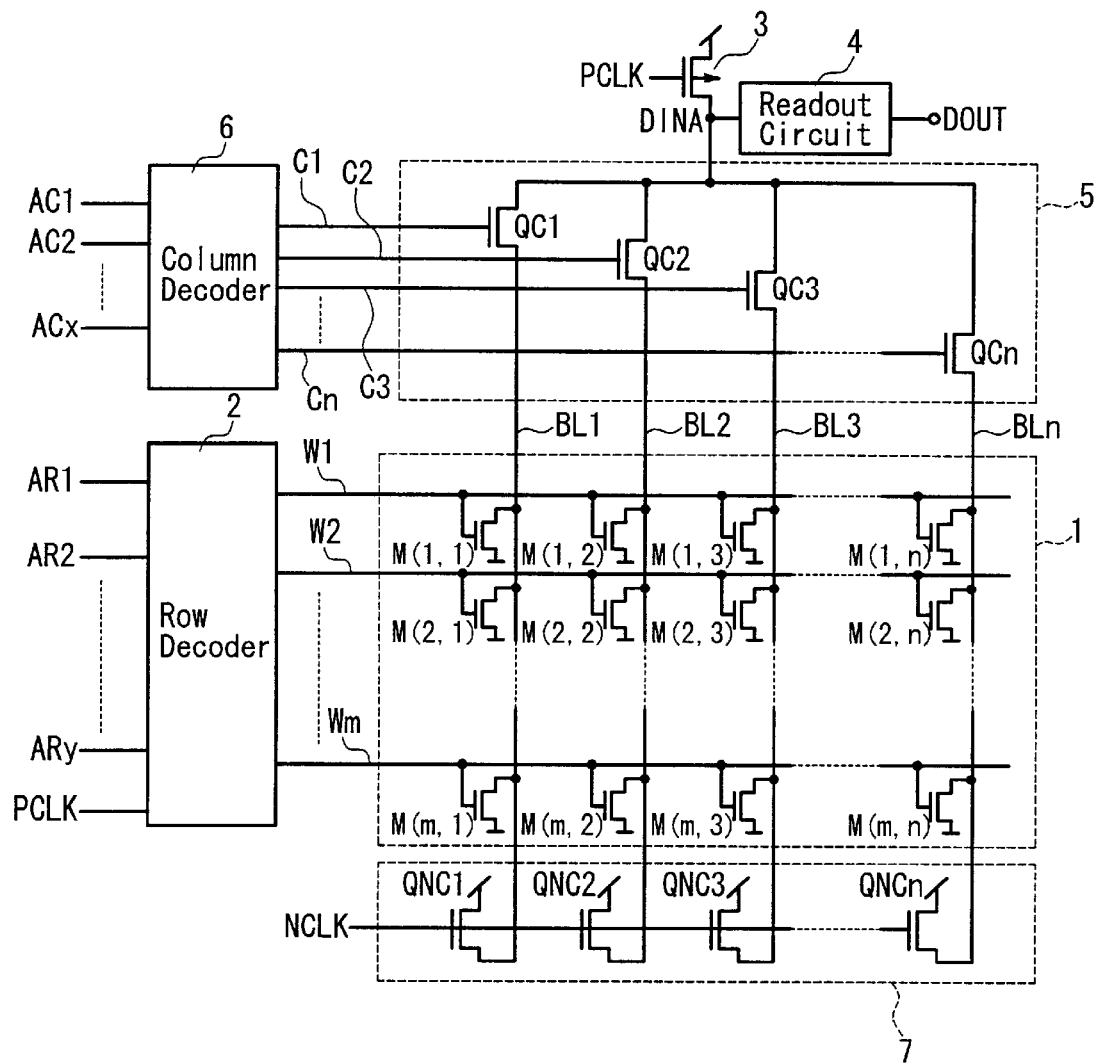
FIG. 1 is a circuit diagram illustrating a configuration of a semiconductor memory device according to a first embodiment of the present invention.

The following description will depict a preferred embodiment of the present invention, while referring to the drawings.

First Embodiment

FIG. 1 is a circuit diagram illustrating a configuration of a semiconductor memory device according to a first embodiment of the present invention.

In FIG. 1, a semiconductor memory device includes a memory cell array 1, a row decoder 2, a precharge transistor 3, a readout circuit 4, a bit line selection circuit 5, a column decoder 6, and a bit line precharge transistor group 7. It should be noted that in the figure the memory cell array 1, the row decoder 2, the precharge transistor 3, and the readout circuit 4 are the same as those in the prior art. Therefore, the elements thereof are designated with the same reference numerals, and the descriptions of the same are omitted.

The bit line selection circuit 5 is composed of N-type MOS transistors QCj (j=1 to n) whose sources are connected with bit lines BLj (j=1 to n), respectively, whose gates are connected with bit line selection signals Cj (j=1 to n), respectively, and whose drains are connected with a connection DINA that connects a drain of the precharge transistor 3 and the readout circuit 4.

The column decoder 6 selects and outputs bit line selection signals Cj (j=1 to n) corresponding to inputted column addresses AC1 to ACx. It should be noted that in the present embodiment, the bit line selection signals Cj selected make transition to a logic "H" level, while the other bit line selection signals Cj make transition to a logic "L" level.

The bit line precharge transistor group 7 is composed of N-type MOS transistors QNCj (j=1 to n) whose sources are connected with a power source potential, whose gates are fed with a bit line precharge signal NCLK, and whose drains are connected with the bit lines BLj (j=1 to n), respectively.

An operation of reading out data from a memory cell M(i,j), performed by the semiconductor memory device thus configured, is described with reference to a timing chart of FIG. 2, taking an operation of reading out data from a memory cell M(2,2) as an example. It should be noted that in the present embodiment, in the initial state, the word lines Wi, the bit line selection signals Cj, the bit lines BLj, the connection DINA, the bit line precharge selection signal NCLK, and the output terminal DOUT have a ground potential.

Figure 2:
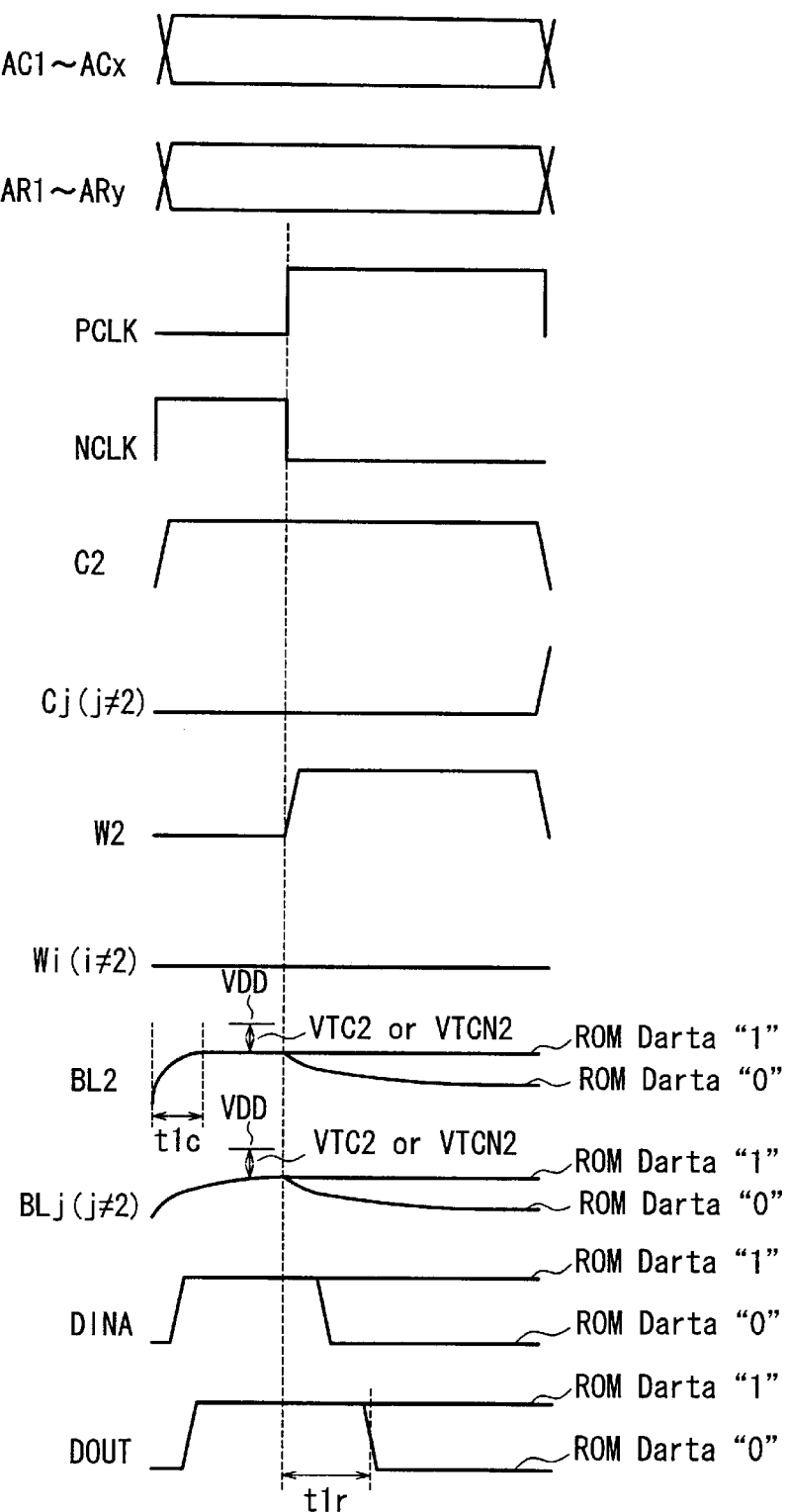
FIG. 2 is a timing chart illustrating an operation of the semiconductor memory device according to the first embodiment of the present invention.

In FIG. 2, while the precharge signal PCLK is at the "L" level, the row addresses AR1 to ARy make transition to addresses for selecting the word line W2 and are inputted to the row decoder 2, and the column addresses AC1 to ACx make transition to addresses for selecting the bit line BL2 and are inputted to the column decoder 6.

First of all, the row decoder 2 causes all the word lines Wi (i=1 to m) to have the "L" level so as to cause the memory cells M(i,j) whose gates are connected with the word line Wi to be in the non-conducting state. The column decoder 6 causes the bit line selection signal C2 corresponding to the second column to make transition to the "H" level, and causes the other bit line selection signals Cj (j=1, 3, ... n) to make transition to the "L" level, so as to cause the N-type MOS transistor QC2 to make transition to the conducting state, and so as to cause the other N-type MOS transistors QCj (j=1, 3, ... n) to make transition to the non-conducting state.

Further, while the precharge signal PCLK is at the "L" level and the bit line precharge signal NCLK is at the "H" level, the precharge transistor 3 and the N-type MOS transistor QNC 2 are in the conducting state. Here, the connection DINA and the bit line BL2 that is connected with the N-type MOS transistor QC2 in the conducting state are charged by the precharge transistor 3 and by the N-type MOS transistor QNC2. The connection DINA is charged so as to have a power source potential (VDD), and the bit line BL2 is charged so as to have either a difference (VDD−VTC2) between the power source potential (VDD) and a threshold value (VTC2) of the N-type MOS transistor QC2, or a difference (VDD−VTNC2) between the power source potential and a threshold value (VTNC2) of the N-type MOS transistor QNC2, during a period of time t1c.

Subsequently, since the precharge signal PCLK makes transition to the "H" level and the bit line precharge signal NCLK makes transition to the "L" level, the row decoder 2 causes the word line W2 to make transition to the "H" level, and causes the other word lines Wi (i=1, 3, ..., m) to remain at the "L" level, so that the memory cells M(2,j) (j=1 to n) whose gates are connected with the word line W2 make transition to the conducting state.

Here, when the memory cell M(2,2) is not connected with the bit line BL2, that is, the ROM data is "1", charges accumulated in the connection DINA and the bit line BL2 are not discharged, and the readout circuit 4 outputs data of "1" to the output terminal DOUT. On the other hand, when the memory cell M(2,2) is connected with the bit line BL2, that is, the ROM data is "0", charges accumulated in the connection DINA and the bit line BL2 are discharged, so that the readout circuit 4 outputs data of "0" to the output terminal DOUT after a period of time t1r.

As described above, according to the present embodiment, the charged potential of the bit line is equal to a potential obtained by subtracting the threshold value of the N-type MOS transistor from the power source potential. For instance, with the power source voltage of 1.5 V and the threshold value of the N-type MOS transistor of 0.5 V, the charged potential is 1.0 V, which is significantly lower than the conventional case in which the bit line is charged so as to have the power source potential. Therefore, the time required for charging can be decreased drastically. Furthermore, since the transistors QNCj (j=1 to n) that are connected directly with the bit lines, in addition to the precharge transistor 3 connected with the connection DINA, are used to charge the bit lines, it is possible to charge the bit lines at a higher speed. With these, the charging time t1c for precharging the bit lines in the present embodiment can be decreased as compared with the charging time t0c for precharging the bit lines in the conventional case.

Furthermore, in the case where the memory cell M(i,j) selected by the word line Wi whose gate is connected thereto is connected with the bit line, the discharging time also is decreased. The discharging time t1r upon reading out the memory cell data "0" in the present embodiment can be decreased as compared with the discharging time t0r upon reading out the memory cell data "0" in the conventional case.

Second Embodiment

Figure 3:
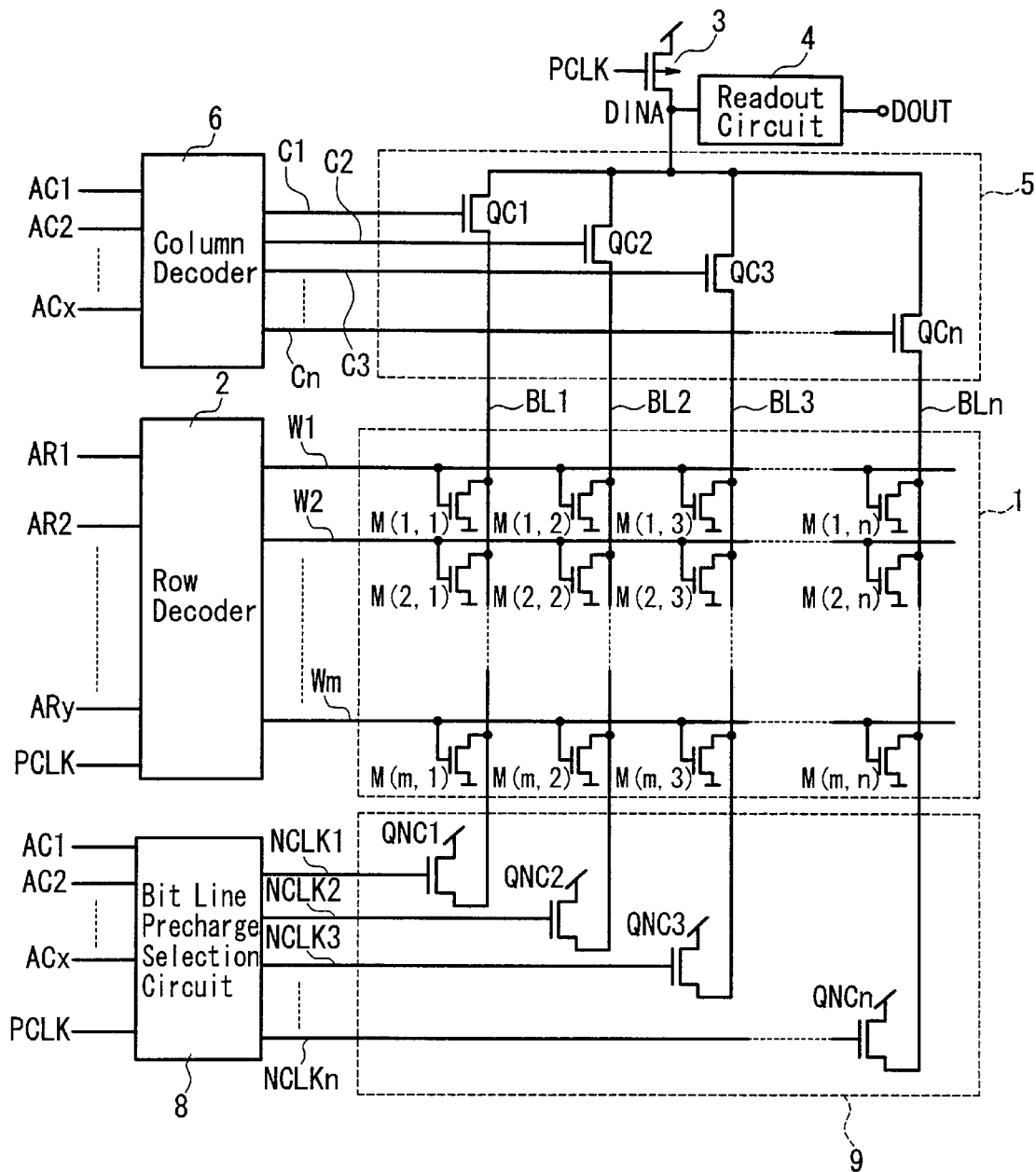
FIG. 3 is a circuit diagram illustrating a configuration of a semiconductor memory device according to a second embodiment of the present invention.

FIG. 3 is a circuit diagram illustrating a configuration of a semiconductor memory device according to a second embodiment of the present invention.

In FIG. 3, a semiconductor memory device includes a memory cell array 1, a row decoder 2, a precharge transistor 3, a readout circuit 4, a bit line selection circuit 5, a column decoder 6, a bit line precharge selection circuit 8, and a bit line precharge transistor group 9. It should be noted that in the figure, the memory cell array 1, the row decoder 2, the precharge transistor 3, the readout circuit 4, the bit line selection circuit 5, and the column decoder 6 are the same as those in the first embodiment. Therefore, the elements thereof are designated with the same reference numerals, and descriptions of the same are omitted.

The bit line precharge selection circuit 8 is supplied with column addresses AC1 to ACx and a precharge signal PCLK as inputs thereto. When the precharge signal PCLK is at the "H" level, the bit line precharge selection circuit 8 makes all the bit line precharge transistor selection signals NCLKJ (j=1 to n) unselected. It selects the bit line precharge transistor selection signals NCLKj (j=1 to n) corresponding to inputted column addresses AC1 to ACx when the precharge signal PCLK is at the "L" level. In the present embodiment, the selected bit line precharge transistor selection signals NCLKJ have the "H" level, and the other unselected bit line precharge transistor selection signals NCLKj have the "L" level.

The bit line precharge transistor group 9 is composed of N-type MOS transistors QNCj (j=1 to n) whose sources are connected with the power source potential, whose gates are fed with the bit line precharge transistor selection signals NCLKj (j=1 to n), respectively, and whose drains are connected with the bit lines BLj (j=1 to n), respectively.

An operation of reading out data from a memory cell M(i,j), performed by the semiconductor memory device thus configured, is described with reference to a timing chart of FIG. 4, taking an operation of reading out data from a memory cell M(2,2) as an example. It should be noted that in the present embodiment, in the initial state, the word lines Wi, the bit line selection signals Cj, the bit lines BLj, the connection DINA, the bit line precharge transistor selection signals NCLKj, and the output terminal DOUT have a ground potential.

Figure 4:
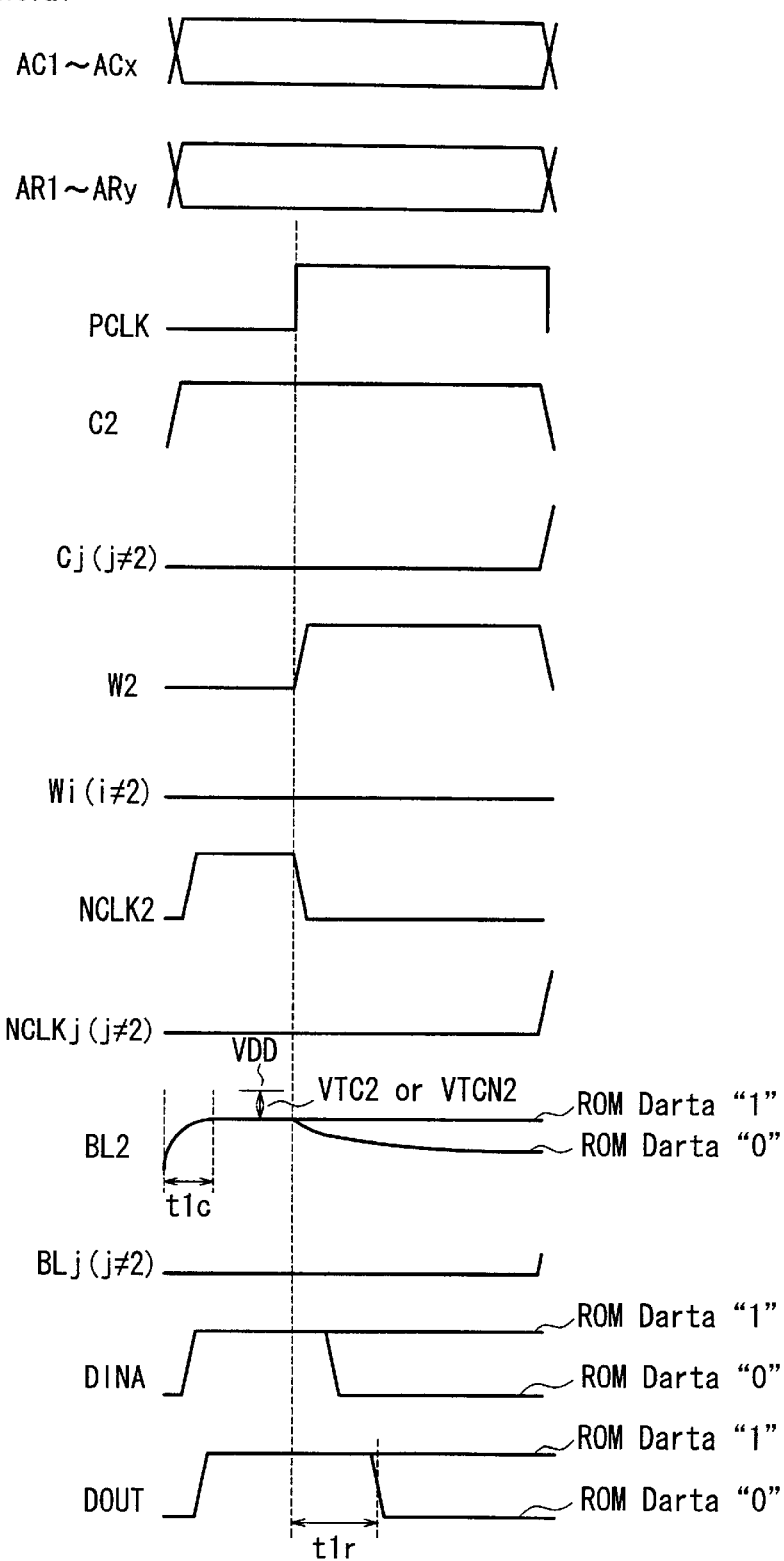
FIG. 4 is a timing chart illustrating an operation of the semiconductor memory device according to the second embodiment of the present invention.

In FIG. 4, while the precharge signal PCLK is at the "L" level, the row addresses AR1 to ARy make transition to addresses for selecting the word line W2 and are inputted to the row decoder 2, and the column addresses AC1 to ACx make transition to addresses for selecting the bit line BL2 and are inputted to the column decoder 6 and the bit line precharge selection circuit 8.

First of all, the row decoder 2 causes all the word lines Wi (i=1 to m) to have the "L" level so as to cause the memory cells M(i,j) whose gates are connected with the word line Wi to be in the non-conducting state. The column decoder 6 causes the bit line selection signal C2 corresponding to the second column to make transition to the "H" level, and causes the other bit line selection signals Cj (j=1, 3, . . . n) to make transition to the "L" level, so as to cause the N-type MOS transistor QC2 to make transition to the conducting state, and so as to cause the other N-type MOS transistors QCj (j=1, 3, . . . n) to make transition to the non-conducting state.

Next, the bit line precharge selection circuit 8 causes the bit line precharge transistor selection signal NCLK2 to make transition to the "H" level, and causes the other signals NCLKj (j=1, 3, . . . , n) to make transition to the "L" level. By doing so, in the precharge transistor group 9 for each bit line, supplied with the bit line precharge transistor selection signals NCLKj (j=1 to n) via each gate, only the N-type MOS transistor QNC2 supplied with the bit line precharge transistor selection signal NCLK2 via its gate is caused to be in the conducting state, while the other N-type MOS transistors QNCj (j=1, 3, . . . , n) are caused to be in the non-conducting state.

Consequently, while the precharge signal PCLK is at the "L" level, the precharge transistor 3, the N-type MOS transistor QC2, and the N-type MOS transistor QNC 2 are in the conducting state. At the same time, the connection DINA, and the bit line BL2 that is connected with the N-type MOS transistor QC2 and the N-type MOS transistor QNC2 are charged by the precharge transistor 3 and by the N-type MOS transistor QNC2. The connection DINA is charged so as to have a power source potential (VDD), and the bit line BL2 is charged so as to have either a difference (VDD−VTC2) between the power source potential (VDD) and a threshold value (VTC2) of the N-type MOS transistor QC2, or a difference (VDD−VTNC2) between the power source potential and a threshold value (VTNC2) of the N-type MOS transistor QNC2, during a period of time t1c.

Subsequently, since the precharge signal PCLK makes transition to the "H" level, the row decoder 2 causes the word line W2 to make transition to the "H" level, and causes the other word lines Wi (i=1, 3, . . . , m) to remain at the "L" level, so that the memory cells M(2,j) (j=1 to n) whose gates are connected with the word line W2 make transition to the conducting state.

Here, when the memory cell M(2,2) is not connected with the bit line BL2, that is, the ROM data is "1", charges accumulated in the connection DINA and the bit line BL2 are not discharged, and the readout circuit 4 outputs data of "1" to the output terminal DOUT. On the other hand, when the memory cell M(2,2) is connected with the bit line BL2, that is, the ROM data is "0", charges accumulated in the connection DINA and the bit line BL2 are discharged, so that the readout circuit 4 outputs data of "0" to the output terminal DOUT after a period of time t1r.

As described above, the present embodiment, like the first embodiment, allows the time required for charging a bit line to decrease (t1c<t0c). Besides, it also allows the time required for discharging a bit line upon reading out a memory cell data to decrease (t1r<t0r). Furthermore, since only the bit line BLj provided with the memory cell M(i,j) from which data is read out is charged, the power consumption can be decreased significantly.

Third Embodiment

FIG. 5 is a circuit diagram illustrating a configuration of a semiconductor memory device according to a third embodiment of the present invention.

In FIG. 5, a semiconductor memory device includes a memory cell array 1, a row decoder 2, a precharge transistor 3, a readout circuit 4, a bit line selection circuit 5, a column decoder 6, a bit line precharge selection circuit 8, a bit line precharge transistor group 9, a bit line grounding selection circuit 11, and a bit line grounding transistor group 12. It should be noted that in the figure the memory cell array 1, the row decoder 2, the precharge transistor 3, the readout circuit 4, the bit line selection circuit 5, the column decoder 6, the bit line precharge selection circuit 8, and the bit line precharge transistor group 9 are the same as those in the second embodiment. Therefore, the elements thereof are designated with the same reference numerals, and descriptions of the same are omitted.

The bit line grounding selection circuit 11 selects bit line grounding transistor selection signals RCLKj (j=1 to n) corresponding to inputted column addresses AC1 to ACx. It should be noted that in the present embodiment, the selected bit line grounding transistor selection signals RCLKj (j=1 to n) have the "L" level, and the other unselected bit line grounding transistor selection signals RCLKj (j=1 to n) have the "H" level.

The bit line grounding transistor group 12 is composed of N-type MOS transistors QNRj (j=1 to n) whose sources are connected with a ground potential, whose gates are fed with the bit line grounding transistor selection signals RCLKj (j=1 to n), respectively, and whose drains are connected with the bit lines BLj (j=1 to n), respectively.

An operation of reading out data from a memory cell M(i,j) performed by the semiconductor memory device thus configured is described with reference to a timing chart of FIG. 6, taking an operation of reading out data from a memory cell M(1,1) during the first period, data from a memory cell M(1,3) during the second period, and data from a memory cell M(2,2) during the third period, as an example. Here, it is assumed that the memory cells M(2,1) and M(2,3) are in states of being connected with the bit lines BL1 and BL3, respectively, while the other memory cells M(i,j) including memory cells M(1,1), M(1,3), and M(2,2) are in states of being not connected with the bit lines BLj.

It should be noted that in the present embodiment, in the initial state, the word lines Wi, the bit line selection signals Cj, the bit lines BLj, the connection DINA, the bit line precharge transistor selection signals NCLKj, the bit line grounding transistor selection signals RCLKj, and the output terminal DOUT have a ground potential.

Figure 6:
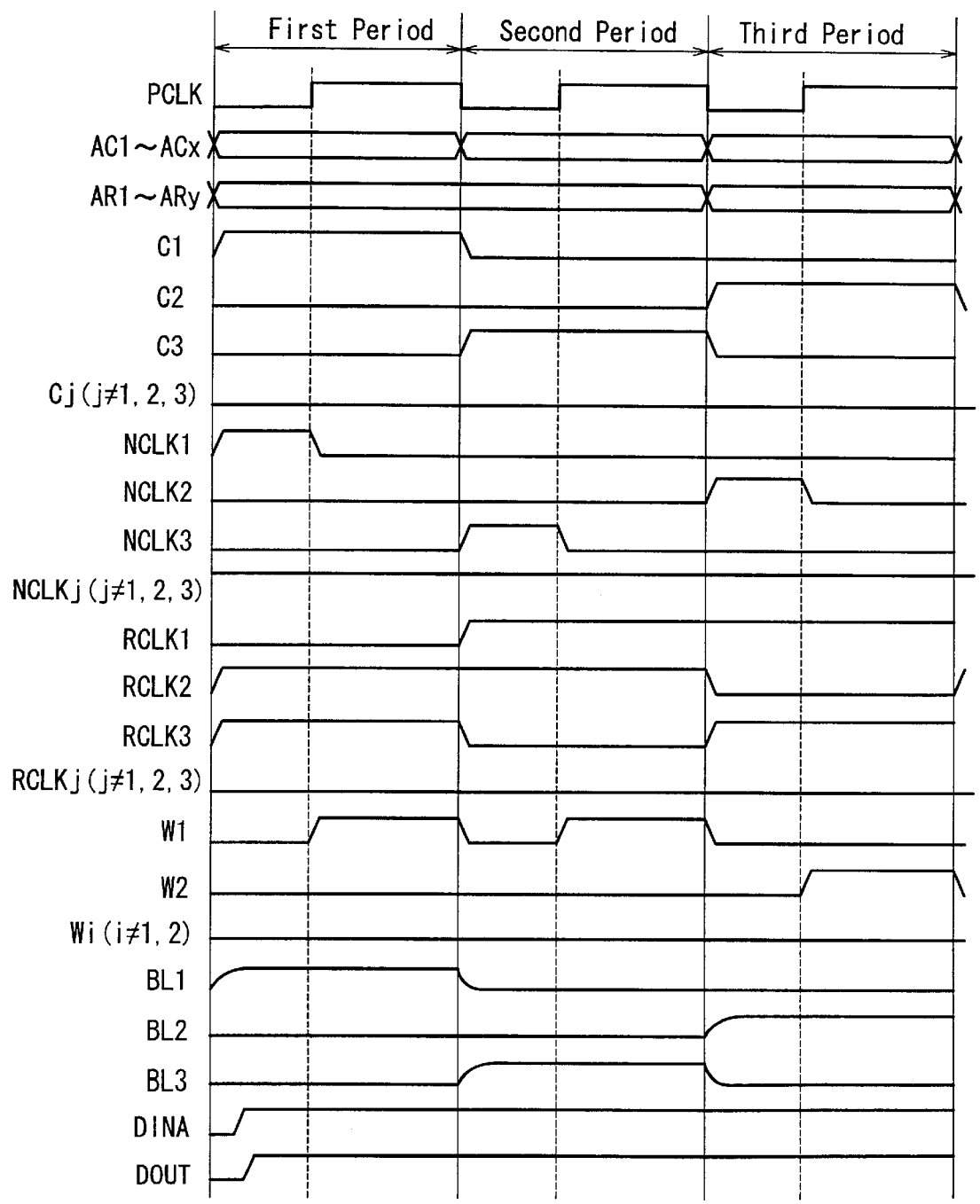
FIG. 6 is a timing chart illustrating an operation of the semiconductor memory device according to the third embodiment of the present invention.

(1) In FIG. 6, in the first period, while the precharge signal PCLK is at the "L" level, the row addresses AR1 to ARy make transition to addresses for selecting the word line W1 and are inputted to the row decoder 2, and the column addresses AC1 to ACx make transition to addresses for selecting the bit line BL1 and are inputted to the column decoder 6, the bit line precharge selection circuit 8, and the bit line grounding selection circuit 11.

First of all, the row decoder 2 causes all the word lines Wi (i=1 to m) to have the "L" level so as to cause the memory cells M(i,j) whose gates are connected with the word line Wi to be in the non-conducting state. The column decoder 6 causes the bit line selection signal C1 corresponding to the first column to make transition to the "H" level, and causes the other bit line selection signals Cj (j=2 to n) to make transition to the "L" level, so as to cause the N-type MOS transistor QC1 to make transition to the conducting state, and so as to cause the other N-type MOS transistors QCj (j=2 to n) to make transition to the non-conducting state.

Next, the bit line precharge selection circuit 8 causes the bit line precharge transistor selection signal NCLK1 to make transition to the "H" level, and causes the other signals NCLKj (j=2 to n) to make transition to the "L" level. By doing so, in the bit line precharge transistor group 9 supplied with the bit line precharge transistor selection signals NCLKj (j=1 to n) via each gate, only the N-type MOS transistor QNC1 supplied with the bit line precharge transistor selection signal NCLK1 via its gate is caused to be in the conducting state, while the other N-type MOS transistors QNCj (j=2 to n) are caused to be in the non-conducting state.

Besides, the bit line grounding selection circuit 11 causes the bit line grounding transistor selection signal RCLK1 to make transition to the "L" level, and causes the other bit line grounding transistor selection signals RCLKj (j=2 to n) to make transition to the "H" level. By doing so, in the bit line grounding transistor group 12 supplied with the bit line grounding transistor selection signals RCLKj (j=1 to n) via each gate, the N-type MOS transistor QNR1 supplied with the bit line grounding transistor selection signal RCLK1 via its gate is caused to be in the non-conducting state, while the other N-type MOS transistors QNRj (j=2 to n) are caused to be in the conducting state.

Consequently, while the precharge signal PCLK is at the "L" level, the bit lines BLj except for the bit line BL1 have a ground potential, and the precharge transistor 3, the N-type MOS transistor QC1, and the N-type MOS transistor QNC1 are in the conducting state. At the same time, the connection DINA, and the bit line BL1 that is connected with the N-type MOS transistor QC1 and the N-type MOS transistor QNC1, are charged by the precharge transistor 3 and by the N-type MOS transistor QNC1, respectively. The connection DINA is charged so as to have a power source potential (VDD), and the bit line BL1 is charged so as to have either a difference (VDD−VTC1) between the power source potential (VDD) and a threshold value (VTC1) of the N-type MOS transistor QC1, or a difference (VDD−VTNC1) between the power source potential (VDD) and a threshold value (VTNC1) of the N-type MOS transistor QNC1, during a period of time t1c.

Subsequently, since the precharge signal PCLK makes transition to the "H" level, the row decoder 2 causes the word line W1 to make transition to the "H" level, and causes the other word lines Wi (i=2 to m) to remain at the "L" level, so that the memory cells M(1,j) (j=1 to n) whose gates are connected with the word line Wi make transition to the conducting state.

Here, since the memory cell M(1,1) is not connected with the bit line BL1 (i.e., the ROM data is "1") as assumed above, charges accumulated in the connection DINA and the bit line BL1 are not discharged, and the readout circuit 4 outputs data of "1" to the output terminal DOUT.

(2) Next, in the second period, while the precharge signal PCLK is at the "L" level, the row addresses AR1 to ARy make transition to addresses for selecting the word line W1 and are inputted to the row decoder 2, and the column addresses AC1 to ACx make transition to addresses for selecting the bit line BL3 and are inputted to the column decoder 6, the bit line precharge selection circuit 8, and the bit line grounding selection circuit 11.

First of all, the row decoder 2 causes all the word lines Wi (i=1 to m) to have the "L" level so as to cause the memory cells M(i,j) whose gates are connected with the word line Wi to be in the non-conducting state. The column decoder 6 causes the bit line selection signal C3 corresponding to the third column to make transition to the "H" level, and causes the other bit line selection signals Cj (j=1, 2, 4, . . . , n) to make transition to the "L" level, so as to cause the N-type MOS transistor QC3 to make transition to the conducting state, and so as to cause the other N-type MOS transistors QCj (j=1, 2, 4, . . . , n) to make transition to the non-conducting state.

Next, the bit line precharge selection circuit 8 causes the bit line precharge transistor selection signal NCLK3 to make transition to the "H" level, and causes the other signals NCLKj (j=1, 2, 4, . . . , n) to make transition to the "L" level. By doing so, in the bit line precharge transistor group 9 supplied with the bit line precharge transistor selection signals NCLKj (j=1 to n) via each gate, only the N-type MOS transistor QNC3 supplied with the bit line precharge transistor selection signal NCLK3 via its gate is caused to be in the conducting state, while the other N-type MOS transistors QNCj (j=1, 2, 4, . . . , n) are caused to be in the non-conducting state.

Besides, the bit line grounding selection circuit 11 causes the bit line grounding transistor selection signal RCLK3 to make transition to the "L" level, and causes the other bit line grounding transistor selection signals RCLKj (j=1, 2, 4, . . . , n) to make transition to the "H" level. By doing so, in the bit line grounding transistor group 12 supplied with the bit line grounding transistor selection signals RCLKj (j=1 to n) via each gate, the N-type MOS transistor QNR3 supplied with the bit line grounding transistor selection signal RCLK3 via its gate is caused to be in the non-conducting state, while the other N-type MOS transistors QNRj (j=1, 2, 4, . . . , n) are caused to be in the conducting state.

Consequently, while the precharge signal PCLK is at the "L" level, the bit lines BLj except for the bit line BL3 have a ground potential, and the precharge transistor 3, the N-type MOS transistor QC3, and the N-type MOS transistor QNC3 are in the conducting state. At the same time, the connection DINA, and the bit line BL3 that is connected with the N-type MOS transistor QC3 and the N-type MOS transistor QNC3, are charged by the precharge transistor 3 and by the N-type MOS transistor QNC3. The connection DINA is charged so as to have a power source potential (VDD), and the bit line BL1 is charged so as to have either a difference (VDD–VTC3) between the power source potential (VDD) and a threshold value (VTC3) of the N-type MOS transistor QC3, or a difference (VDD–VTNC3) between the power source potential (VDD) and a threshold value (VTNC3) of the N-type MOS transistor QNC3, during a period of time $t1c$.

Subsequently, since the precharge signal PCLK makes transition to the "H" level, the row decoder 2 causes the word line W1 to make transition to the "H" level, and causes the other word lines Wi (i=2 to m) to remain at the "L" level, so that the memory cells M(1,j) (j=1 to n) whose gates are connected with the word line W1 make transition to the conducting state.

Here, since the memory cell M(1,3) is not connected with the bit line BL3 (i.e., the ROM data is "1") as assumed above, charges accumulated in the connection DINA and the bit line BL3 are not discharged, and the readout circuit 4 outputs data of "1" to the output terminal DOUT.

(3) Next, in the third period, while the precharge signal PCLK is at the "L" level, the row addresses AR1 to ARy make transition to addresses for selecting the word line W2 and are inputted to the row decoder 2, and the column addresses AC1 to ACx make transition to addresses for selecting the bit line BL2 and are inputted to the column decoder 6, the bit line precharge selection circuit 8, and the bit line grounding selection circuit 11.

First of all, the row decoder 2 causes all the word lines Wi (i=1 to m) to have the "L" level so as to cause the memory cells M(i,j) whose gates are connected with the word line Wi to be in the non-conducting state. The column decoder 6 causes the bit line selection signal C2 corresponding to the first column to make transition to the "H" level, and causes the other bit line selection signals Cj (j=1, 3, . . . , n) to make transition to the "L" level, so as to cause the N-type MOS transistor QC2 to make transition to the conducting state, and so as to cause the other N-type MOS transistors QCj (j=1, 3, . . . , n) to make transition to the non-conducting state.

Next, the bit line precharge selection circuit 8 causes the bit line precharge transistor selection signal NCLK2 to make transition to the "H" level, and causes the other signals NCLKj (j=1, 3, . . . , n) to make transition to the "L" level. By doing so, in the bit line precharge transistor group 9 supplied with the bit line precharge transistor selection signals NCLKj (j=1 to n) via each gate, the N-type MOS transistor QNC2 supplied with the bit line precharge transistor selection signal NCLK2 via its gate is caused to be in the conducting state, while the other N-type MOS transistors QNCj (j=1, 3, . . . , n) are caused to be in the non-conducting state.

Besides, the bit line grounding selection circuit 11 causes the bit line grounding transistor selection signal RCLK2 to make transition to the "L" level, and causes the other bit line grounding transistor selection signals RCLKj (j=1, 3, . . . , n) to make transition to the "H" level. By doing so, in the bit line grounding transistor group 12 supplied with the bit line grounding transistor selection signals RCLKj (j=1 to n) via each gate, the N-type MOS transistor QNR2 supplied with the bit line grounding transistor selection signal RCLK2 via its gate is caused to be in the non-conducting state, while the other N-type MOS transistors QNRj (j=1, 3, . . . , n) are caused to be in the conducting state.

Consequently, while the precharge signal PCLK is at the "L" level, the bit lines BLj except for the bit line BL2 have a ground potential, and the precharge transistor 3, the N-type MOS transistor QC2, and the N-type MOS transistor QNC2 are in the conducting state. At the same time, the connection DINA, and the bit line BL2 that is connected with the N-type MOS transistor QC2 and the N-type MOS transistor QNC2 are charged by the precharge transistor 3 and by the N-type MOS transistor QNC2. The connection DINA is charged so as to have a power source potential (VDD), and the bit line BL1 is charged so as to have either a difference (VDD–VTC2) between the power source potential (VDD) and a threshold value (VTC2) of the N-type MOS transistor QC2, or a difference (VDD–VTNC2) between the power source potential and a threshold value (VTNC2) of the N-type MOS transistor QNC2, during a period of time $t1c$.

Subsequently, since the precharge signal PCLK makes transition to the "H" level, the row decoder 2 causes the word line W2 to make transition to the "H" level, and causes the other word lines Wi (i=1, 3, . . . , m) to remain at the "L" level, so that the memory cells M(2,j) (j=1 to n) whose gates are connected with the word line W2 make transition to the conducting state.

Here, since the memory cell M(2,2) is not connected with the bit line BL2 (i.e., the ROM data is "1") as assumed above, charges accumulated in the connection DINA and the bit line BL2 are not discharged, and the readout circuit 4 outputs data of "1" to the output terminal DOUT.

As described above, the present embodiment, like the second embodiment, allows the time required for charging a bit line to decrease ($t1c < t0c$). Besides, it also allows the time required for discharging a bit line upon reading out a memory cell data to decrease ($t1r < t0r$). Furthermore, since only the bit line BLj provided with the memory cell M(i,j) from which data is read out is charged, the power consumption can be decreased significantly.

Furthermore, in addition to the above, according to the present embodiment, while a selected bit line is precharged, all the bit lines except for the selected bit line are forced to be at the ground potential. Therefore, when data are read out from a selected memory cell, charges by no means move via line capacities between a bit line having the selected memory cell and an adjacent bit line toward the adjacent bit line, and for this reason, no malfunction occurs even in the case where line capacitances between the lines increase. This allows the line intervals to be decreased to the limit of the micromachining technology, thereby allowing the occupied area to be decreased.

Fourth Embodiment

Figure 7:
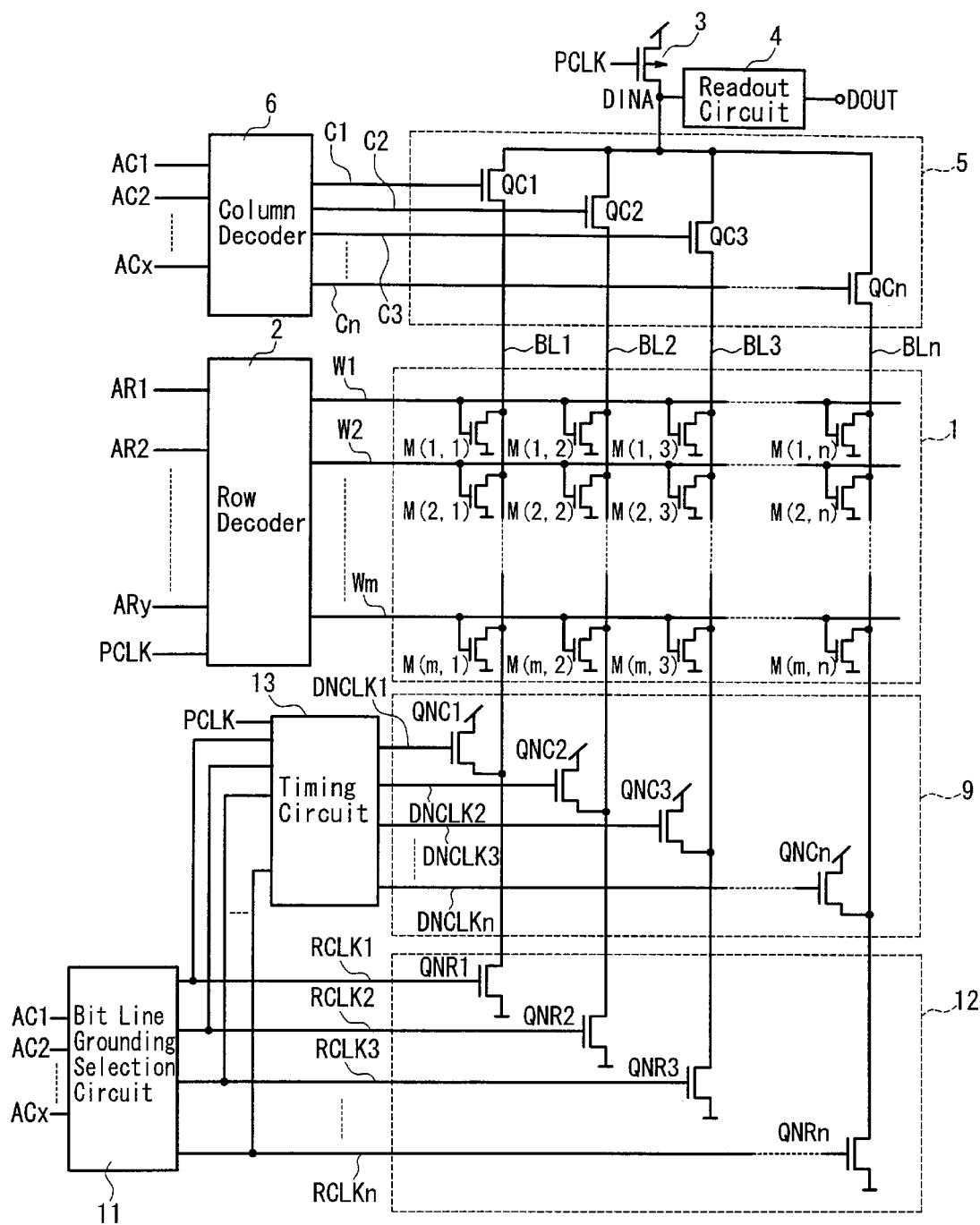
FIG. 7 is a circuit diagram illustrating a configuration of a semiconductor memory device according to a fourth embodiment of the present invention.

FIG. 7 is a circuit diagram illustrating a configuration of a semiconductor memory device according to a fourth embodiment of the present invention.

In FIG. 7, a semiconductor memory device includes a memory cell array 1, a row decoder 2, a precharge transistor 3, a readout circuit 4, a bit line selection circuit 5, a column decoder 6, a bit line precharge transistor group 9, a bit line grounding selection circuit 11, a bit line grounding transistor group 12, and a timing circuit 13. It should be noted that in the figure the memory cell array 1, the row decoder 2, the precharge transistor 3, the readout circuit 4, the column decoder 6, the bit line precharge transistor group 9, the bit line grounding selection circuit 11, and the bit line grounding transistor group 12 are the same as those in the third embodiment. Therefore, the elements thereof are designated with the same reference numerals, and descriptions of the same are omitted.

The timing circuit 13 is supplied with a precharge signal PCLK and bit line grounding transistor selection signals RCLKj (j=1 to n) as inputs thereto. While the precharge signal PCLK is at the "L" level, the timing circuit 13 delays, for a period of time td, bit line precharge transistor selection signals DNCLKj (j=1 to n) that have phases opposite to the phases of the bit line grounding transistor selection signals RCLKj (j=1 to n), respectively, and outputs the same. While the precharge signal PCLK is at the "H" level, the timing circuit 13 causes all the bit line precharge transistor selection signals DNCLKj (j=1 to n) to have the "L" level. The bit line precharge transistor selection signals DNCLKj (j=1 to n) are fed to the gates of the N-type MOS transistors QNCj (j=1 to n) composing the bit line precharge transistor group 9, respectively.

An operation of reading out data from a memory cell M(i,j), performed by the semiconductor memory device thus configured, is described with reference to a timing chart of FIG. 8, taking an operation of reading out data from a memory cell M(1,1) during the first period, data from a memory cell M(1,3) during the second period, and data from a memory cell M(2,2) during the third period, as an example. Here, it is assumed that the memory cells M(2,1) and M(2,3) are in states of being connected with the bit lines BL1 and BL3, respectively, while the other memory cells M(i,j) including memory cells M(1,1), M(1,3), and M(2,2) are in states of being not connected with the bit lines BLj.

It should be noted that in the present embodiment, in the initial state, the word lines Wi, the bit line selection signals Cj, the bit lines BLj, the connection DINA, the bit line precharge transistor selection signals NCLKJ, the bit line grounding transistor selection signals RCLKj, and the output terminal DOUT have a ground potential.

Figure 8:
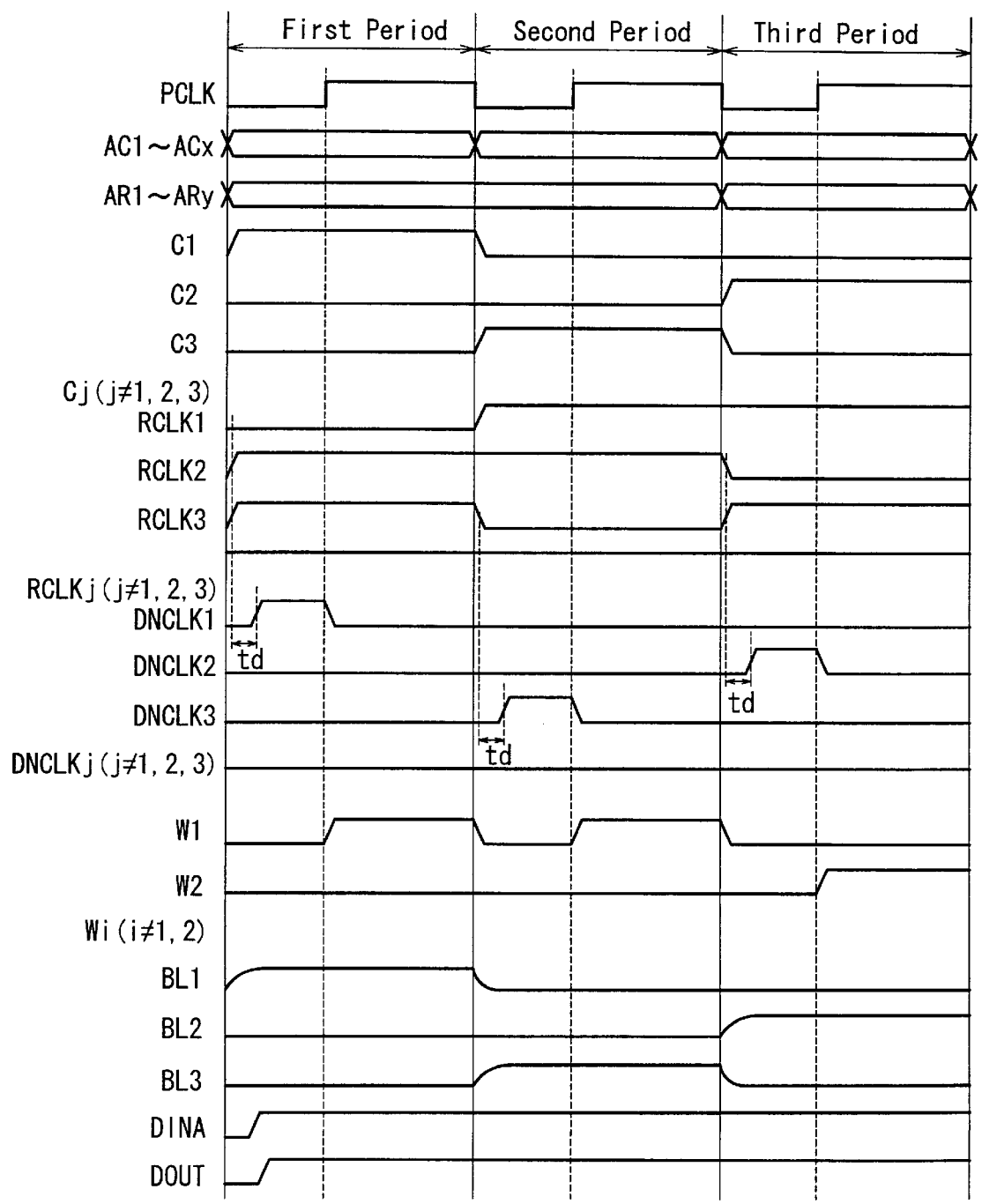
FIG. 8 is a timing chart illustrating an operation of the semiconductor memory device according to the fourth embodiment of the present invention.
Figure 9:
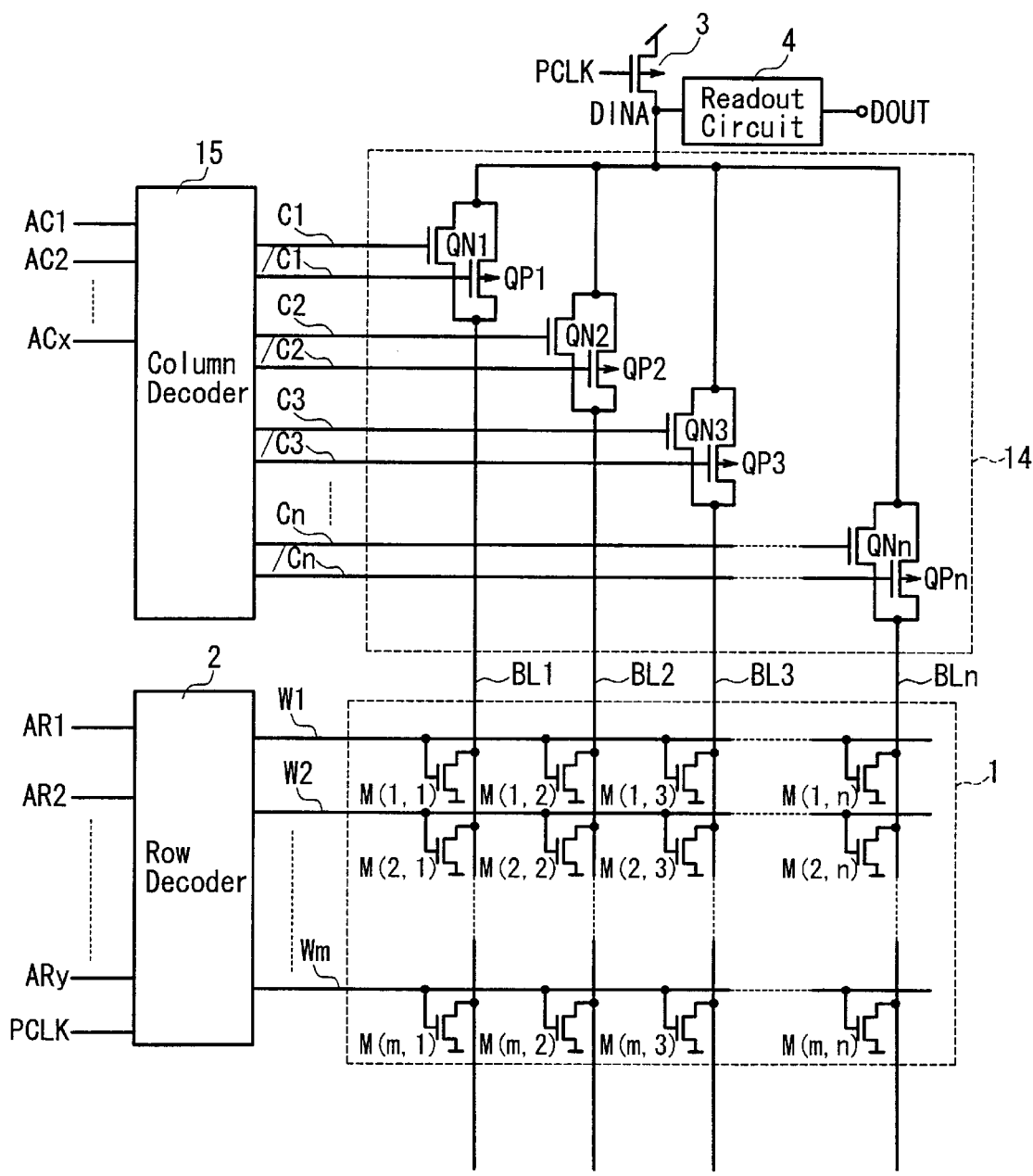
FIG. 9 is a circuit diagram illustrating a configuration of a conventional semiconductor memory device.
Figure 10:
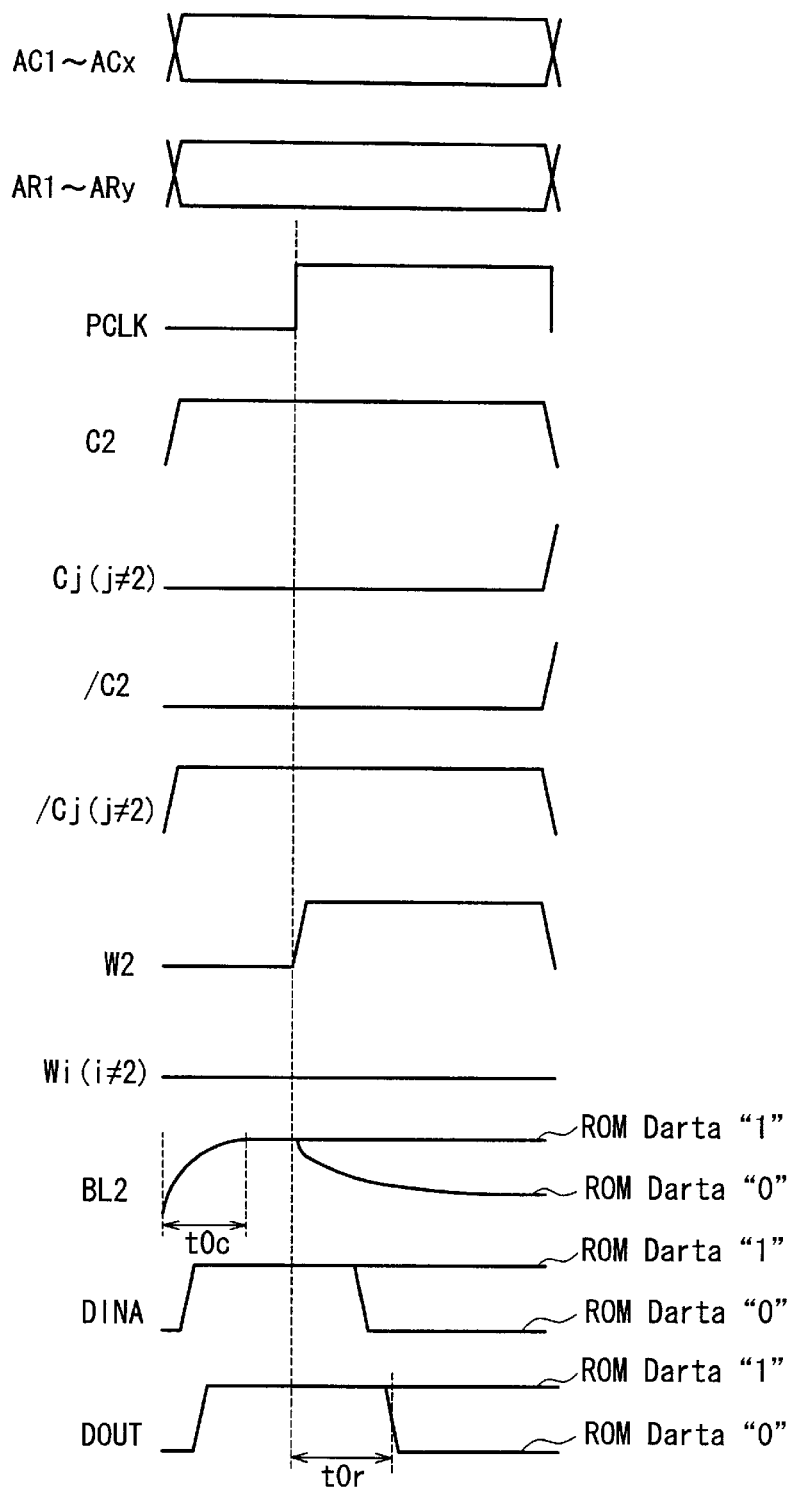
FIG. 10 is a timing chart illustrating an operation of the conventional semiconductor memory device.
Figure 11:
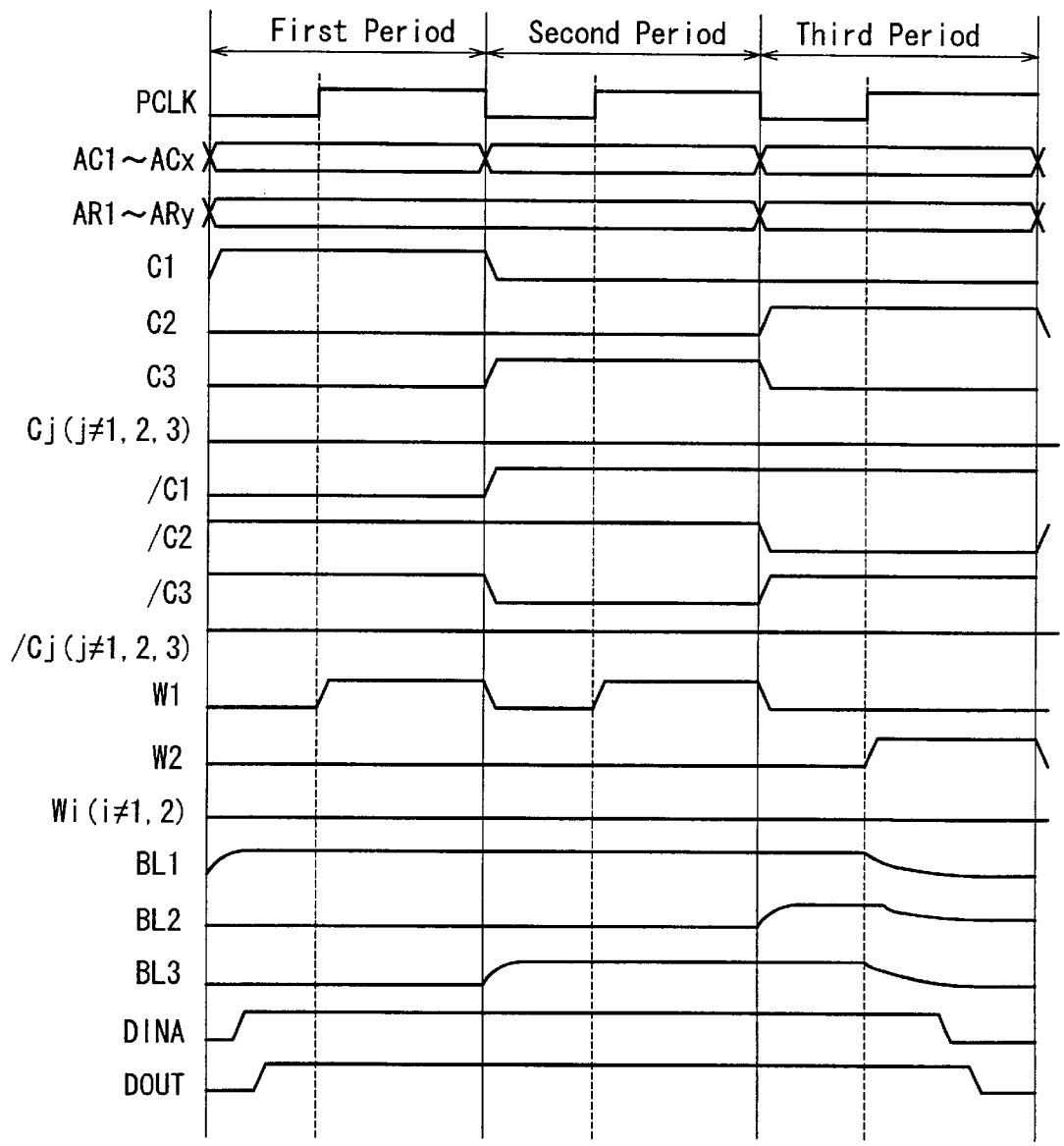
FIG. 11 is a timing chart illustrating an operation for explaining problems of the conventional semiconductor memory device.

(1) In FIG. 8, in the first period, while the precharge signal PCLK is at the "L" level, the row addresses AR1 to ARy make transition to addresses for selecting the word line WI and are inputted to the row decoder 2, and the column addresses AC1 to ACx make transition to addresses for selecting the bit line BL1 and are inputted to the column decoder 6 and the bit line grounding selection circuit 11.

First of all, the row decoder 2 causes all the word lines Wi (i=1 to m) to have the "L" level so as to cause the memory cells M(i,j) whose gates are connected with the word line Wi to be in the non-conducting state. The column decoder 6 causes the bit line selection signal C1 corresponding to the first column to make transition to the "H" level, and causes the other bit line selection signals Cj (j=2 to n) to make transition to the "L" level, so as to cause the N-type MOS transistor QC1 to make transition to the conducting state, and so as to cause the other N-type MOS transistors QCj (j=2 to n) to make transition to the non-conducting state.

Next, the bit line grounding selection circuit 11 causes the bit line grounding transistor selection signal RCLK1 to make transition to the "L" level, and causes the other bit line grounding transistor selection signals RCLKj (j=2 to n) to make transition to the "H" level. By doing so, in the bit line grounding transistor group 12 supplied with the bit line grounding transistor selection signals RCLKj (j=1 to n) via each gate, only the N-type MOS transistor QNR1 supplied with the bit line grounding transistor selection signal RCLK1 via its gate is caused to be in the non-conducting state, while the other N-type MOS transistors QNRj (j=2 to n) are caused to be in the conducting state.

Besides, in response to the transition of the bit line grounding transistor selection signal RCLK1 to the "L" level and the transition of the other bit line grounding transistor selection signals RCLKj (j=2 to n) to the "H" level, the timing circuit 13, after a period of time td, causes the bit line precharge transistor selection signal DNCLK1 to make transition to the "H" level, and causes the other bit line precharge transistor selection signals DNCLKj (j=2 to n) to make transition to the "L" level. By doing so, in the bit line precharge transistor group 9 supplied with the bit line precharge transistor selection signals DNCLKj via each gate, the N-type MOS transistor QNC1 supplied with the bit line precharge transistor selection signal DNCLK1 via its gate is caused to be in the conducting state, while the other N-type MOS transistors QNCj (j=2 to n) are caused to be in the non-conducting state.

Consequently, while the precharge signal PCLK is at the "L" level, the bit lines BLj except for the bit line BL1 have a ground potential, and the precharge transistor 3, the N-type MOS transistor QC1, and the N-type MOS transistor QNC1 are in the conducting state. At the same time, the connection DINA, and the bit line BL1 that is connected with the N-type MOS transistor QC1 and the N-type MOS transistor QNC1, are charged by the precharge transistor 3 and by the N-type MOS transistor QNC1. The connection DINA is charged so as to have a power source potential (VDD), and the bit line BL1 is charged so as to have either a difference (VDD−VTC1) between the power source potential (VDD) and a threshold value (VTC1) of the N-type MOS transistor QC1, or a difference (VDD−VTNC1) between the power source potential (VDD) and a threshold value (VTNC1) of the N-type MOS transistor QNC1, during a period of time t1c.

Subsequently, since the precharge signal PCLK makes transition to the "H" level, the row decoder 2 causes the word line W1 to make transition to the "H" level, and causes the other word lines Wi (i=2 to m) to remain at the "L" level, so that the memory cells M(1,j) j=1 to n) whose gates are connected with the word line W1 make transition to the conducting state.

Here, since the memory cell M(1,1) is not connected with the bit line BL1 (i.e., the ROM data is "1") as assumed above, charges accumulated in the connection DINA and the bit line BL1 are not discharged, and the readout circuit 4 outputs data of "1" to the output terminal DOUT.

(2) Next, in the second period, while the precharge signal PCLK is at the "L" level, the row addresses AR1 to ARy make transition to addresses for selecting the word line W1 and are inputted to the row decoder 2, and the column addresses AC1 to ACx make transition to addresses for selecting the bit line BL3 and are inputted to the column decoder 6 and the bit line grounding selection circuit 11.

First of all, the row decoder 2 causes all the word lines Wi (i=1 to m) to have the "L" level so as to cause the memory cells M(i,j) whose gates are connected with the word line Wi to be in the non-conducting state. The column decoder 6 causes the bit line selection signal C3 corresponding to the third column to make transition to the "H" level, and causes the other bit line selection signals Cj (j=1, 2, 4, . . . , n) to make transition to the "L" level, so as to cause the N-type MOS transistor QC3 to make transition to the conducting state, and so as to cause the other N-type MOS transistors QCj (j=1, 2, 4, . . . , n) to make transition to the non-conducting state.

Next, the bit line grounding selection circuit 11 causes the bit line grounding transistor selection signal RCLK3 to make transition to the "L" level, and causes the other bit line grounding transistor selection signals RCLKj (j=1, 2, 4, . . . , n) to make transition to the "H" level. By doing so, in the bit line grounding transistor group 12 supplied with the bit line grounding transistor selection signals RCLKj (j=1 to n) via each gate, the N-type MOS transistor QNR3 supplied with the bit line grounding transistor selection signal RCLK3 via its gate is caused to be in the non-conducting state, while the other N-type MOS transistors QNRj (j=1, 2, 4, . . . , n) are caused to be in the conducting state.

Besides, in response to the transition of the bit line grounding transistor selection signal RCLK3 to the "L" level and the transition of the other bit line grounding transistor selection signals RCLKj (j=1, 2, 4, . . . , n) to the "H" level, the timing circuit 13, after a period of time td, causes the bit line precharge transistor selection signal DNCLK3 to make transition to the "H" level, and causes the other bit line precharge transistor selection signals DNCLKj (j=1, 2, 4, . . . , n) to make transition to the "L" level. By doing so, in the bit line precharge transistor group 9 supplied with the bit line precharge transistor selection signals DNCLKj via each gate, the N-type MOS transistor QNC3 supplied with the bit line precharge transistor selection signal DNCLK3 via its gate is caused to be in the conducting state, while the other N-type MOS transistors QNCj (j=1, 2, 4, . . . , n) are caused to be in the non-conducting state.

Consequently, while the precharge signal PCLK is at the "L" level, the bit lines BLj except for the bit line BL3 have a ground potential, and the precharge transistor 3, the N-type MOS transistor QC3, and the N-type MOS transistor QNC3 are in the conducting state. At the same time, the connection DINA, and the bit line BL3 that is connected with the N-type MOS transistor QC3 and the N-type MOS transistor QNC3, are charged by the precharge transistor 3 and by the N-type MOS transistor QNC3. The connection DINA is charged so as to have a power source potential (VDD), and the bit line BL3 is charged so as to have either a difference (VDD−VTC3) between the power source potential (VDD) and a threshold value (VTC3) of the N-type MOS transistor QC3, or a difference (VDD−VTNC3) between the power source potential and a threshold value (VTNC3) of the N-type MOS transistor QNC3, during a period of time t1c.

Subsequently, since the precharge signal PCLK makes transition to the "H" level, the row decoder 2 causes the word line W1 to make transition to the "H" level, and causes the other word lines Wi (i=2 to m) to remain at the "L" level, so that the memory cells M(1,j) (j=1 to n) whose gates are connected with the word line W1 make transition to the conducting state.

Here, since the memory cell M(1,3) is not connected with the bit line BL3 (i.e., the ROM data is "1") as assumed above, charges accumulated in the connection DINA and the bit line BL3 are not discharged, and the readout circuit 4 outputs data of "1" to the output terminal DOUT.

(3) Next, in the third period, while the precharge signal PCLK is at the "L" level, the row addresses AR1 to ARy make transition to addresses for selecting the word line W2 and are inputted to the row decoder 2, and the column addresses AC1 to ACx make transition to addresses for selecting the bit line BL2 and are inputted to the column decoder 6 and the bit line grounding selection circuit 11.

First of all, the row decoder 2 causes all the word lines Wi (i=1 to m) to have the "L" level so as to cause the memory cells M(i,j) whose gates are connected with the word line Wi to be in the non-conducting state. The column decoder 6 causes the bit line selection signal C2 corresponding to the second column to make transition to the "H" level, and causes the other bit line selection signals Cj (j=1, 3, . . . , n) to make transition to the "L" level, so as to cause the N-type MOS transistor QC2 to make transition to the conducting state, and so as to cause the other N-type MOS transistors QCj (j=1, 3, . . . , n) to make transition to the non-conducting state.

Next, the bit line grounding selection circuit 11 causes the bit line grounding transistor selection signal RCLK2 to make transition to the "L" level, and causes the other bit line grounding transistor selection signals RCLKj (j=1, 3, . . . , n) to make transition to the "H" level. By doing so, in the bit line grounding transistor group 12 supplied with the bit line grounding transistor selection signals RCLKj (j=1 to n) via each gate, the N-type MOS transistor QNR2 supplied with the bit line grounding transistor selection signal RCLK2 via its gate is caused to be in the non-conducting state, while the other N-type MOS transistors QNRj (j=1, 3, . . . , n) are caused to be in the conducting state.

Besides, in response to the transition of the bit line grounding transistor selection signal RCLK2 to the "L" level and the transition of the other bit line grounding transistor selection signals RCLKj (j=1, 3, . . . , n) to the "H" level, the timing circuit 13, after a period of time td, causes the bit line precharge transistor selection signal DNCLK2 to make transition to the "H" level, and causes the other bit line precharge transistor selection signals DNCLKj (j=1, 3, . . . , n) to make transition to the "L" level. By doing so, in the bit line precharge transistor group 9 supplied with the bit line precharge transistor selection signals DNCLKj via each gate, the N-type MOS transistor QNC2 supplied with the bit line precharge transistor selection signal DNCLK2 via its gate is caused to be in the conducting state, while the other N-type MOS transistors QNCj (j=1, 3, . . . n) are caused to be in the non-conducting state.

Consequently, while the precharge signal PCLK is at the "L" level, the bit lines BLj except for the bit line BL2 have a ground potential, and the precharge transistor 3, the N-type MOS transistor QC2, and the N-type MOS transistor QNC2 are in the conducting state. At the same time, the connection DINA, and the bit line BL2 that is connected with the N-type MOS transistor QC2 and the N-type MOS transistor QNC2 are charged by the precharge transistor 3 and by the N-type MOS transistor QNC2, respectively. The connection DINA is charged so as to have a power source potential (VDD), and the bit line BL2 is charged so as to have either a difference (VDD−VTC2) between the power source potential (VDD) and a threshold value (VTC2) of the N-type MOS transistor QC2, or a difference (VDD−VTNC2) between the power source potential and a threshold value (VTNC2) of the N-type MOS transistor QNC2, during a period of time t1c.

Subsequently, since the precharge signal PCLK makes transition to the "H" level, the row decoder 2 causes the word line W2 to make transition to the "H" level, and causes the other word lines Wi (i=1, 3, . . . , m) to remain at the "L" level, so that the memory cells M(2,j) (j=1 to n) whose gates are connected with the word line W2 make transition to the conducting state.

Here, since the memory cell M(2,2) is not connected with the bit line BL2 (i.e., the ROM data is "1") as assumed above, charges accumulated in the connection DINA and the bit line BL2 are not discharged, and the readout circuit 4 outputs data of "1" to the output terminal DOUT.

As described above, the present embodiment, like the third embodiment, allows the time required for charging a bit line to decrease (t1c<t0c), allows the time required for discharging a bit line upon reading out a memory cell data to decrease (t1r<t0r), and ensures a decrease in the power consumption and a decrease in the occupied area. In addition to these, the present embodiment allows the bit line precharge transistors to be in the conducting state after the bit line grounding transistors make transition to the non-conducting state. Therefore, the bit line precharge transistors and the bit line grounding transistors are prevented from simultaneously being in the conducting state, and hence, the generation of a feedthrough current can be prevented. As a result, the power source can be stabilized, and unnecessary electric power can be omitted.

As described above, the present invention allows the following specific effects to be achieved. Namely, a high-speed data reading-out is enabled by decreasing a charging time during a bit line precharging operation and by decreasing a discharging time during a memory cell data reading-out operation. Furthermore, even in the case where adjacent bit lines not involved in a precharging operation or in data reading-out operation make transition to the ground potential, it is possible to provide a semiconductor memory device that does not undergo a malfunction due to an increase in the capacitances between the bit lines.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device that reads out data from memory cells provided in a matrix according to address signals supplied from outside, the semiconductor memory device comprising:

a bit line selection circuit including a plurality of first transistors for selecting a plurality of bit lines, respectively, according to a plurality of column selection signals that are generated based on address signals;

a bit line charging circuit including a plurality of second transistors for charging the plurality of bit lines, respectively, the second transistors being N-type MOS transistors and disposed between a respective bit line and a power source;

a read out circuit coupled to an output of the bit line selection circuit for outputting data from the memory cells; and a common pre-charge transistor for commonly charging the plurality of bit lines, the common pre-charge transistor being a P-type MOS transistor and disposed between the output of the bit line selection circuit and the power source, wherein the bit line selection circuit is configured such that a full supply voltage level of the power source is not transferred from the output of the bit line selection circuit to the plurality of bit lines.

2. The semiconductor memory device according to claim 1, wherein:

each of the plurality of first transistors is an N-type MOS transistor having a gate to which a corresponding one of the plurality of column selection signals is supplied, a source with which a corresponding one of the plurality of bit lines is connected, and a drain with which the common pre-charge transistor is connected;

each of the plurality of second transistors has a gate to which a bit line pre-charge signal is supplied commonly, a source to which a power source potential is supplied from the power source, and a drain connected with a corresponding one of the plurality of bit lines; and each of the plurality of bit lines is connected to the output of the bit line selection circuit through a corresponding one of the plurality of first transistors such that when the corresponding one of the plurality of first transistors is activated it is the only current path available.

3. A semiconductor memory device that reads out data from memory cells provided in a matrix according to address signals supplied from outside, the semiconductor memory device comprising:

a bit line selection circuit including a plurality of first transistors for selecting a plurality of bit lines, respectively, according to a plurality of column selection signals that are generated based on address signals;

a bit line charging circuit including a plurality of second transistors for charging the plurality of bit lines, respectively, the second transistors being N-type MOS transistors and disposed between a respective bit line and a power source;

a read out circuit coupled to an output of the bit line selection circuit for outputting data from the memory cells; and a common pre-charge transistor for commonly charging the plurality of bit lines, the common pre-charge transistor being a P-type MOS transistor and disposed between the output of the bit line selection circuit and the power source, wherein:

each of the plurality of first transistors is an N-type MOS transistor having a gate to which a corresponding one of the plurality of column selection signals is supplied, a source with which a corresponding one of the plurality of bit lines is connected, and a drain with which the common pre-charge transistor is connected; and each of the plurality of second transistors has a gate to which a corresponding one of a plurality of first selection signals is supplied, a source to which a power source potential is supplied from the power source, and a drain with which a corresponding one of the plurality of bit lines is connected.

4. The semiconductor memory device according to claim 3, wherein the plurality of first selection signals are generated so that only the bit line selected according to the address signals is precharged.

5. The semiconductor memory device according to claim 3, further comprising a bit line grounding circuit that includes a plurality of third transistors for connecting the plurality of bit lines with a ground potential, respectively.

6. The semiconductor memory device according to claim 5, wherein the plurality of third transistors are N-type MOS transistors, and each of the N-type MOS transistors has a gate to which each of a plurality of second selection signals having logic states opposite to those of the plurality of column selection signals, respectively, is supplied, a source connected with a ground potential, and a drain connected with each of the plurality of bit lines.

7. The semiconductor memory device according to claim 6, wherein the plurality of first selection signals are generated based on the plurality of second selection signals so as to have a delay of a predetermined time relative to the plurality of second selection signals.

* * * * *